(12) United States Patent
Masuda et al.

(10) Patent No.: US 9,299,790 B2
(45) Date of Patent: Mar. 29, 2016

(54) SILICON CARBIDE SEMICONDUCTOR DEVICE

(71) Applicant: Sumitomo Electric Industries, Ltd., Osaka-shi (JP)

(72) Inventors: Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/646,686

(22) PCT Filed: Nov. 27, 2013

(86) PCT No.: PCT/JP2013/081865
§ 371 (c)(1),
(2) Date: May 21, 2015

(87) PCT Pub. No.: WO2014/112214
PCT Pub. Date: Jul. 24, 2014

(65) Prior Publication Data
US 2015/0303267 A1    Oct. 22, 2015

(30) Foreign Application Priority Data
Jan. 15, 2013   (JP) .................................. 2013-004632

(51) Int. Cl.
*H01L 29/78*    (2006.01)
*H01L 29/16*    (2006.01)
(Continued)

(52) U.S. Cl.
CPC ........ *H01L 29/1608* (2013.01); *H01L 29/0619* (2013.01); *H01L 29/0623* (2013.01);
(Continued)

(58) Field of Classification Search
CPC ............ H01L 29/1608; H01L 29/0619; H01L 29/7811; H01L 29/0692; H01L 29/0688

USPC .......................................................... 257/77
See application file for complete search history.

(56) References Cited

U.S. PATENT DOCUMENTS 4,134,123 A *  1/1979  Shannon ............. H01L 29/0619
                                                148/DIG. 88
6,037,632 A    3/2000  Omura et al.
(Continued)

FOREIGN PATENT DOCUMENTS

JP    09-191109 A    7/1997
JP    11-330496 A    11/1999
(Continued)

OTHER PUBLICATIONS

International Search Report in PCT International Application No. PCT/JP2013/081865, dated Feb. 10, 2014.

*Primary Examiner* — Mark Tornow
(74) *Attorney, Agent, or Firm* — Venable LLP; Michael A. Sartori

(57) ABSTRACT

First and second ranges of a silicon carbide film have an interface. The first range includes: a first breakdown voltage holding layer having a first conductivity type; and an outer edge embedded region provided at an interface in the outer edge portion and having a second conductivity type. The second range includes a second breakdown voltage holding layer having the first conductivity type. A semiconductor element is formed in the second range. The first range includes: a central section facing the semiconductor element in the central portion in a thickness direction; and an outer edge section facing the semiconductor element in the outer edge portion in the thickness direction. At the interface, the outer edge section includes a portion having an impurity concentration different from the impurity concentration of the central section.

5 Claims, 19 Drawing Sheets

(51) Int. Cl.
   *H01L 29/739* (2006.01)
   *H01L 29/06* (2006.01)
(52) U.S. Cl.
   CPC ........ *H01L29/0688* (2013.01); *H01L 29/0692* (2013.01); *H01L 29/7395* (2013.01); *H01L 29/7397* (2013.01); *H01L 29/78* (2013.01); *H01L 29/7811* (2013.01)

(56) References Cited

U.S. PATENT DOCUMENTS

| | | | |
|---|---|---|---|
| 6,300,171 | B1 | 10/2001 | Frisina |
| 6,639,260 | B2 * | 10/2003 | Suzuki ................ H01L 29/0634 257/288 |
| 2006/0065899 | A1 * | 3/2006 | Hatakeyama ......... H01L 29/045 257/77 |
| 2007/0138482 | A1 * | 6/2007 | Tanimoto ............ H01L 21/0465 257/77 |
| 2007/0272979 | A1 | 11/2007 | Saito et al. |
| 2008/0001159 | A1 | 1/2008 | Ota et al. |

FOREIGN PATENT DOCUMENTS

| | | |
|---|---|---|
| JP | 2000-183350 A | 6/2000 |
| JP | 2002-033479 A | 1/2002 |
| JP | 2008-004643 A | 1/2008 |
| JP | 2008-016461 A | 1/2008 |

* cited by examiner

SILICON CARBIDE SEMICONDUCTOR DEVICE

TECHNICAL FIELD

The present invention relates to a silicon carbide semiconductor device.

BACKGROUND ART

Regarding a Si (silicon) MOSFET (Metal Oxide Semiconductor Field Effect Transistor), which is a power semiconductor device used widely, a main determination factor for breakdown voltage is the upper limit of an electric field strength with which a drift layer serving as a breakdown voltage holding region can withstand. A drift layer made of Si can be broken at a portion fed with an electric field of about 0.3 MV/cm or more. Accordingly, it is required to suppress the electric field strength to be less than a predetermined value in the entire drift layer of the MOSFET. The simplest method is to provide the drift layer with a low impurity concentration. However, this method provides a large on-resistance of the MOSFET, disadvantageously. In other words, there is a trade-off relation between the on-resistance and the breakdown voltage.

Regarding a typical Si MOSFET, Japanese Patent Laying-Open No. 9-191109 illustrates a trade-off relation between the on-resistance and the breakdown voltage in consideration of a theoretical limit resulting from a property value of Si. In order to cancel this trade off, it is disclosed to add a lower p type embedded layer and an upper p type embedded layer in an n type base layer provided on an n type substrate provided on a drain electrode. By the lower p type embedded layer and the upper embedded layer, the n type base layer is divided into a lower stage, a middle stage, and an upper stage, each of which has an equal thickness. According to this publication, voltage is equally held by each of the three stages, whereby the maximum electric field of each stage is maintained to be equal to or less than the critical electric field strength.

Moreover, the publication described above discloses to provide a termination structure having a guard ring (also referred to as "Field Limiting Ring"). Specifically, in the termination structure, guard rings are provided at depth positions respectively corresponding to the three stages described above. More specifically, in the termination portion, embedded guard rings are respectively provided in the n type base layer at two depth positions different from each other, and a guard ring is provided also at a surface of the n type base layer. With these three types of guard rings, the maximum electric field of each stage is also maintained to be equal to or less than the critical strength in the termination structure.

In addition, more generally, a termination structure having a guard ring only at a surface of an n type base layer without having the embedded guard rings described above has been used more widely.

CITATION LIST

Patent Document

PTD 1: Japanese Patent Laying-Open No. 9-191109

SUMMARY OF INVENTION

Technical Problem

As a method for providing further improvement with regard to the trade off between the on-resistance and the breakdown voltage, it has been actively discussed to use SiC instead of Si in recent years. SiC is a material capable of sufficiently withstanding an electric field strength of 0.4 MV/cm or more unlike Si. In other words, under such an electric field strength, a Si layer is likely to be broken whereas a SiC layer is not broken. When such a high electric field can be applied, a problem arises in terms of breakage resulting from electric field concentration at a specific position in the MOSFET structure. For example, in the case of a trench type MOSFET, a breakage phenomenon of a gate insulating film caused by electric field concentration in the gate insulating film rather than a SiC layer is a main determination factor for breakdown voltage. Thus, the determination factor for breakdown voltage differs between the Si semiconductor device and the SiC semiconductor device. Hence, in order to improve the breakdown voltage of the SiC semiconductor device, it is not the best approach to simply apply the technique of the above-described publication, which assumes use of Si. Hence, as to the termination structure for maintaining breakdown voltage, it is preferable to use an optimal one for a SiC semiconductor device.

According to the technique described in the above-described publication, the area of the termination structure in a plane layout directly leads to increase of the area of the semiconductor device. However, the semiconductor device desirably has a smaller size.

The present invention has been made to solve the problem described above, and has an object to provide a silicon carbide semiconductor device having a high breakdown voltage and a small size.

Solution to Problem

A silicon carbide semiconductor device of the present invention has a plane layout including a central portion and an outer edge portion that surrounds the central portion and that constitutes an outer edge. The silicon carbide semiconductor device includes a silicon carbide film, a first electrode, and a second electrode. The silicon carbide film has a first main surface and a second main surface opposite to the first main surface in a thickness direction. The silicon carbide film has a first range that constitutes the first main surface and a second range that constitutes the second main surface. The first and second ranges have an interface separated from the first and second main surfaces between the first and second ranges. The first range includes a first breakdown voltage holding layer and an outer edge embedded region, the first breakdown voltage holding layer constituting the first main surface and having a first conductivity type, the outer edge embedded region being provided partially at the interface in the outer edge portion and having the second conductivity type. The second range includes a second breakdown voltage holding layer that constitutes the interface and that has the first conductivity type. The first and second breakdown voltage holding layers constitute a breakdown voltage holding region in which the outer edge embedded region is embedded. The second range is provided with a semiconductor element for controlling current from one of the second main surface and the interface to the other. The first range has a central section and an outer edge section, the central section facing the semiconductor element in the central portion in the thickness direction, the outer edge section facing the semiconductor element in the outer edge portion in the thickness direction. The outer edge section includes a portion that has an impurity concentration different from an impurity concentration of the central section by having at least a portion of the outer edge embedded region at the interface, the impurity contributing to the second conductivity type. The first electrode faces the first main surface in each of the central portion and the outer edge portion. The second electrode is in contact with the second main surface in each of the central portion and the outer edge portion.

According to the silicon carbide semiconductor device, the outer edge portion has the outer edge section facing the semiconductor element in the thickness direction. That is, the semiconductor element is provided in not only in the central portion but also in the outer edge portion. Moreover, the outer edge section includes a portion having an impurity concentration different from the impurity concentration of the central section by having at least a portion of the outer edge embedded region. Accordingly, the outer edge section can be provided with a termination structure for increasing the breakdown voltage. As described above, both the semiconductor element and the termination structure can be provided in the outer edge portion, so that the size of the device can be made small while increasing a breakdown voltage.

Preferably, the outer edge embedded region includes a guard ring region. The guard ring region surrounds the central portion at the interface. Accordingly, the breakdown voltage can be more increased.

Preferably, the first range includes a relaxation region. The relaxation region is partially provided at the interface, is surrounded by the outer edge embedded region at the interface, has at least a portion included in the central portion, and has the second conductivity type. Accordingly, the breakdown voltage can be more increased.

Preferably, the outer edge embedded region includes a junction terminal region. The junction terminal region is in contact with the relaxation region and has an impurity concentration lower than an impurity concentration of the relaxation region. Accordingly, the breakdown voltage can be more increased.

Preferably, the first range includes a field stop region. The field stop region is partially provided at the interface in the outer edge portion, surrounds the outer edge embedded region at the interface, has the first conductivity type, and has an impurity concentration higher than an impurity concentration of the first breakdown voltage holding layer. Accordingly, the breakdown voltage can be more increased.

Advantageous Effects of Invention

According to the present invention, as described above, the silicon carbide semiconductor device having a high breakdown voltage and a small size is obtained.

DESCRIPTION OF EMBODIMENTS

Figure 1:
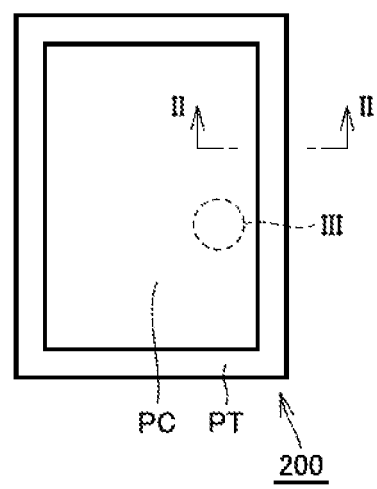
FIG. 1 is a plan view schematically showing a configuration of a silicon carbide semiconductor device in one embodiment of the present invention.

The following describes an embodiment of the present invention based on figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

(Configuration of Silicon Carbide Semiconductor Device)

As shown in FIG. 1, a MOSFET 200 (silicon carbide semiconductor device) serving as a power semiconductor device has a plane layout including a central portion PC and an outer edge portion PT that surrounds central portion PC and constitutes an outer edge.

Figure 2:
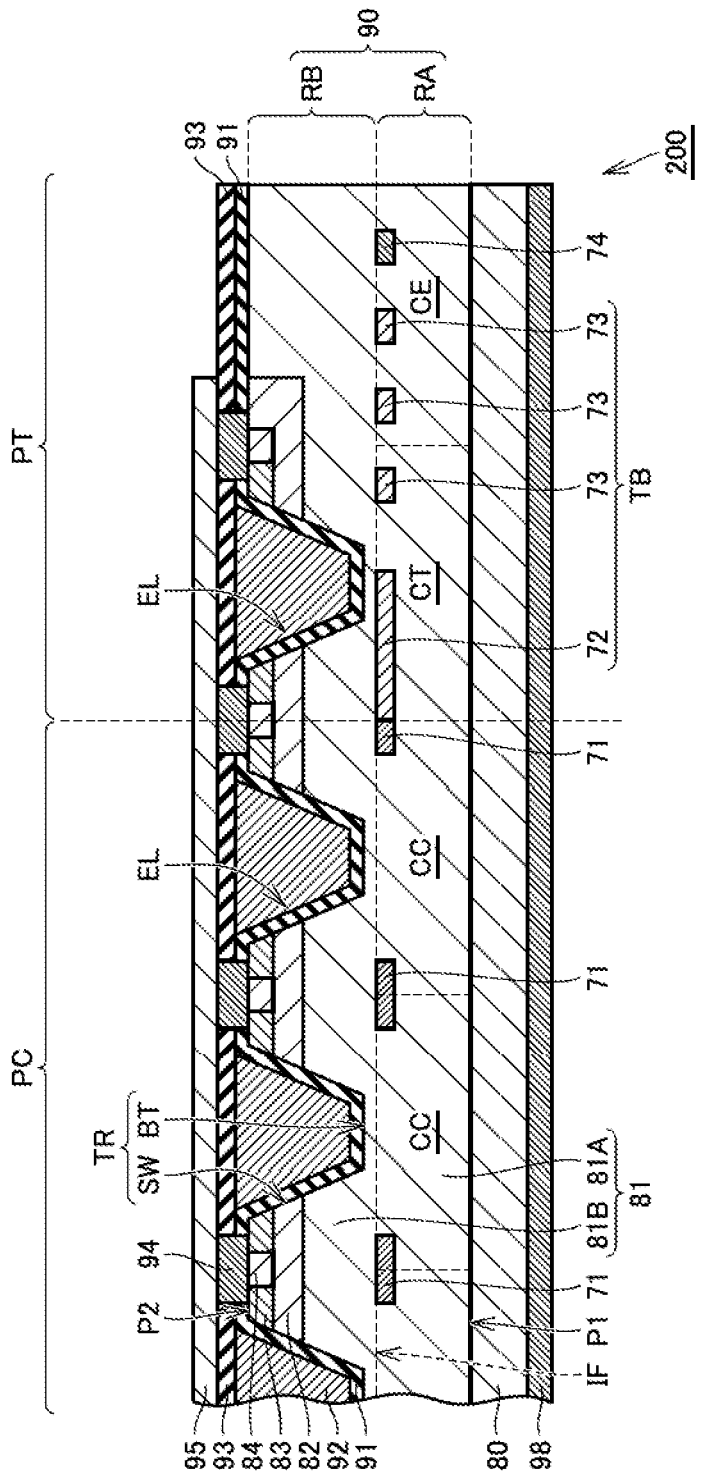
FIG. 2 is a partial schematic cross sectional view taken along a line II-II in FIG. 1.

As shown in FIG. 2, MOSFET 200 has a single-crystal substrate 80, an epitaxial film 90 (silicon carbide film), a gate oxide film 91 (gate insulating film), a gate electrode 92, an interlayer insulating film 93, a source electrode 94 (second electrode), a source interconnection layer 95, and a drain electrode 98 (first electrode).

Single-crystal substrate 80 is made of n type (first conductivity type) silicon carbide. Single-crystal substrate 80 preferably has a hexagonal crystal structure, more preferably, has polytype of 4H.

Epitaxial film 90 (FIG. 3) is a film formed epitaxially on single-crystal substrate 80. As shown in FIG. 2, epitaxial film 90 has a lower surface P1 (first main surface), and an upper surface P2 (second main surface) opposite to lower surface P1 in the thickness direction (longitudinal direction in FIG. 2). Epitaxial film 90 has a lower range RA (first range) constituting lower surface P1 and an upper range RB (second range) constituting upper surface P2. Between lower range RA and upper range RB, lower range RA and upper range RB have an interface IF separated from each of lower surface P1 and upper surface P2.

Lower range RA has a lower drift layer 81A (first breakdown voltage holding layer), a relaxation region 71, an outer edge embedded region TB, and a field stop region 74. Lower drift layer 81A constitutes lower surface P1. Lower drift layer 81A has n type (first conductivity type). Lower drift layer 81A preferably has an impurity concentration lower than the impurity concentration of single-crystal substrate 80. Lower drift layer 81A preferably has an impurity concentration of not less than $1\times10^{15}$ cm$^{-3}$ and not more than $5\times10^{16}$ cm$^{-3}$, for example, $8\times10^{15}$ cm$^{-3}$.

Relaxation region 71 is partially provided at interface IF, is surrounded by outer edge embedded region TB at interface IF, and has at least a portion included in central portion PC. Relaxation region 71 has p type. Relaxation region 71 preferably has an impurity concentration of not less than about $2.5\times10^{13}$ cm$^{-3}$.

Outer edge embedded region TB is partially provided at interface IF in outer edge portion PT, and has p type (second conductivity type). Outer edge embedded region TB has a JTE (Junction Termination Extension) region 72 and a guard ring region 73. JTE region 72 is in contact with relaxation region 71, and preferably surrounds central portion PC at interface IF. JTE region 72 has an impurity concentration lower than the impurity concentration of relaxation region 71. At interface IF, guard ring region 73 surrounds central portion PC. Guard ring region 73 is separated from JTE region 72. Guard ring region 73 preferably has an impurity concentration lower than the impurity concentration of relaxation region 71, and for example, has the same impurity concentration as the impurity concentration of JTE region 72.

Field stop region 74 is partially provided at interface IF in outer edge portion PT, and surrounds outer edge embedded region TB at interface IF. Field stop region 74 has n type and has an impurity concentration higher than the impurity concentration of lower drift layer 81A.

Figure 3:
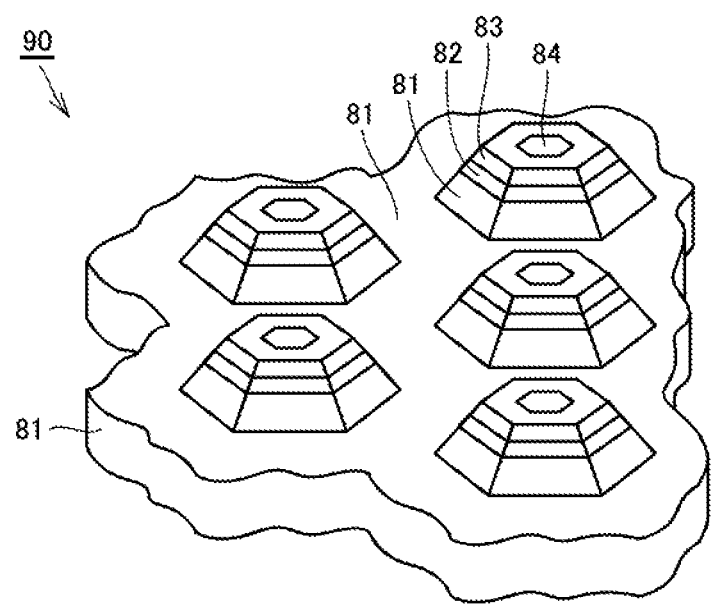
FIG. 3 is a schematic partial cross sectional perspective view of a silicon carbide film included in the silicon carbide semiconductor device in a broken line portion 111 of FIG. 1.

As shown in FIG. 2 and FIG. 3, upper range RB has an upper drift layer 81B (second breakdown voltage holding layer), a base layer 82 (channel forming region), a source region 83, and a contact region 84. Upper drift layer 81B constitutes interface IF. Upper drift layer 81B has n type. The impurity concentration of upper drift layer 81B is the same as that of lower drift layer 81A, for example.

Base layer 82 is provided at upper drift layer 81B. Base layer 82 has p type. The impurity concentration of base layer 82 is $1\times10^{18}$ cm$^{-3}$, for example. Source region 83 is provided on base layer 82, and is separated from upper drift layer 81B by base layer 82. Source region 83 has n type. Contact region 84 is connected to base layer 82. Contact region 84 has p type.

In each of central portion PC and outer edge portion PT, a trench TR is provided in upper surface P2 of upper range RB of epitaxial film 90. Trench TR has a side wall surface SW and a bottom surface BT. Side wall surface SW extends to upper drift layer 81B through source region 83 and base layer 82. Therefore, side wall surface SW includes a portion constituted of base layer 82.

Gate oxide film 91 covers each of side wall surface SW and bottom surface BT of trench TR. Gate oxide film 91 has a portion connecting upper drift layer 81B and source region 83 to each other on base layer 82.

Gate electrode 92 is for switching between the ON state and the OFF state of MOSFET 200. Gate electrode 92 is provided on gate oxide film 91. Gate electrode 92 is disposed on side wall surface SW with gate oxide film 91 interposed therebetween.

According to the above-described configuration, a transistor element EL (semiconductor element) having an MOS structure is formed on side wall surface SW of trench TR provided in upper range RB. By means of gate potential applied to gate electrode 92, transistor element EL can control flow of electrons as carrier from source electrode 94 to collector electrode 98. In other words, by means of the gate potential, transistor element EL can control current from one of upper surface P2 and interface IF to the other.

Lower range RA has a central section CC, an outer edge section CT, and an additional section CE. Central section CC faces transistor element EL in central portion PC in the thickness direction. Outer edge section CT faces transistor element EL in outer edge portion PT in the thickness direction. Additional section CE is disposed at an outer side relative to outer edge section CT in outer edge portion PT, and does not face transistor element EL in the thickness direction.

At interface IF, outer edge section CT has JTE region 72 and guard ring region 73 (at least a portion of outer edge embedded region TB). Regarding an acceptor impurity (impurity contributing to p type), at interface IF, the impurity concentration of each of JTE region 72 and guard ring region 73 is lower than the impurity concentration of relaxation region 71. Hence, regarding the acceptor impurity, at interface IF, each of JTE region 72 and guard ring region 73 has an impurity concentration different from the impurity concentration of relaxation region 71. As described above, regarding the impurity contributing to p type, at interface IF, outer edge section CT includes a portion having an impurity concentration different from the impurity concentration of central section CC by having at least a portion of outer edge embedded region TB.

At interface IF, additional section CE has guard ring region 73 and field stop region 74. It should be noted that additional section CE may not have guard ring region 73 and also may not have field stop region 74. Moreover, with additional section CE being omitted, outer edge section CT may be located at an outermost edge.

Source electrode 94 is in contact with upper surface P2 at each of central portion PC and outer edge portion PT. Specifically, source electrode 94 is in contact with each of source region 83 and contact region 84. Source electrode 94 is an ohmic electrode and is made of silicide, for example. Source interconnection layer 95 is in contact with source electrode 94. Source interconnection layer 95 is, for example, an aluminum layer. Interlayer insulating film 93 insulates between gate electrode 92 and source interconnection layer 95.

Drain electrode 98 faces lower surface P1 in each of central portion PC and outer edge portion PT. Specifically, drain electrode 98 is provided on lower surface P1 of epitaxial film 90 with single-crystal substrate 80 interposed therebetween.

It should be noted that lower drift layer 81A and upper drift layer 81B constitute drift region 81 (breakdown voltage holding region) in which outer edge embedded region TB, relaxation region 71, and field stop region 74 are embedded. During an OFF state, when voltage is applied between source electrode 94 and drain electrode 98 such that the maximum electric field strength in drift region 81 becomes 0.4 MV/cm or more, MOSFET 200 is preferably configured such that the maximum electric field strength in upper range RB becomes less than half of the maximum electric field strength in lower range RA. Such a configuration can be obtained when the impurity concentrations of relaxation region 71. JTE region 72, and guard ring region 73 are made sufficiently high.

Bottom surface BT is separated from lower range RA by upper range RB. In the present embodiment, bottom surface BT has a flat shape substantially parallel to upper surface P2 of epitaxial film 90. It should be noted that bottom surface BT may not be a flat surface and may be substantially in the form of point when viewed in the cross section of FIG. 2, and in this case, trench TR has a V shape.

Side wall surface SW is inclined relative to upper surface P2 of epitaxial film 90, and trench TR therefore expands in a tapered manner toward the opening. The plane orientation of side wall surface SW is preferably inclined by not less than 50° and not more than 80° relative to a {000-1} plane, and is more preferably inclined by not less than 500 and not more than 80° relative to a (000-1) plane. Side wall surface SW may have one of plane orientations of {0-33-8}, {0-11-2}, {0-11-4} and {0-11-1} when viewed macroscopically. It should be noted that the plane orientation of {0-33-8} has an off angle of 54.7° relative to the {000-1} plane. The plane orientation of {0-11-1} has an off angle of 75.1° relative to the {000-1} plane. Therefore, the plane orientations of {0-33-8}, {0-11-2}, {0-11-4}, and {10-11-1} correspond to off angles of 54.7° to 75.1°. In view of such a fact that there is considered a production error of about 5° with regard to the off angle, a process is performed to incline side wall surface SW by about not less than 50° and not more than 80° relative to the {000-1} plane, whereby the macroscopic plane orientation of side wall surface SW is likely to correspond to one of {0-33-8}, {0-11-2}, {0-11-4} and {0-11-1}. Preferably, side wall surface SW has a predetermined crystal plane (also referred to as "special plane") particularly at its portion on base layer 82. Details of the special plane will be described later.

(Method for Manufacturing Silicon Carbide Semiconductor Device)

Figure 4:
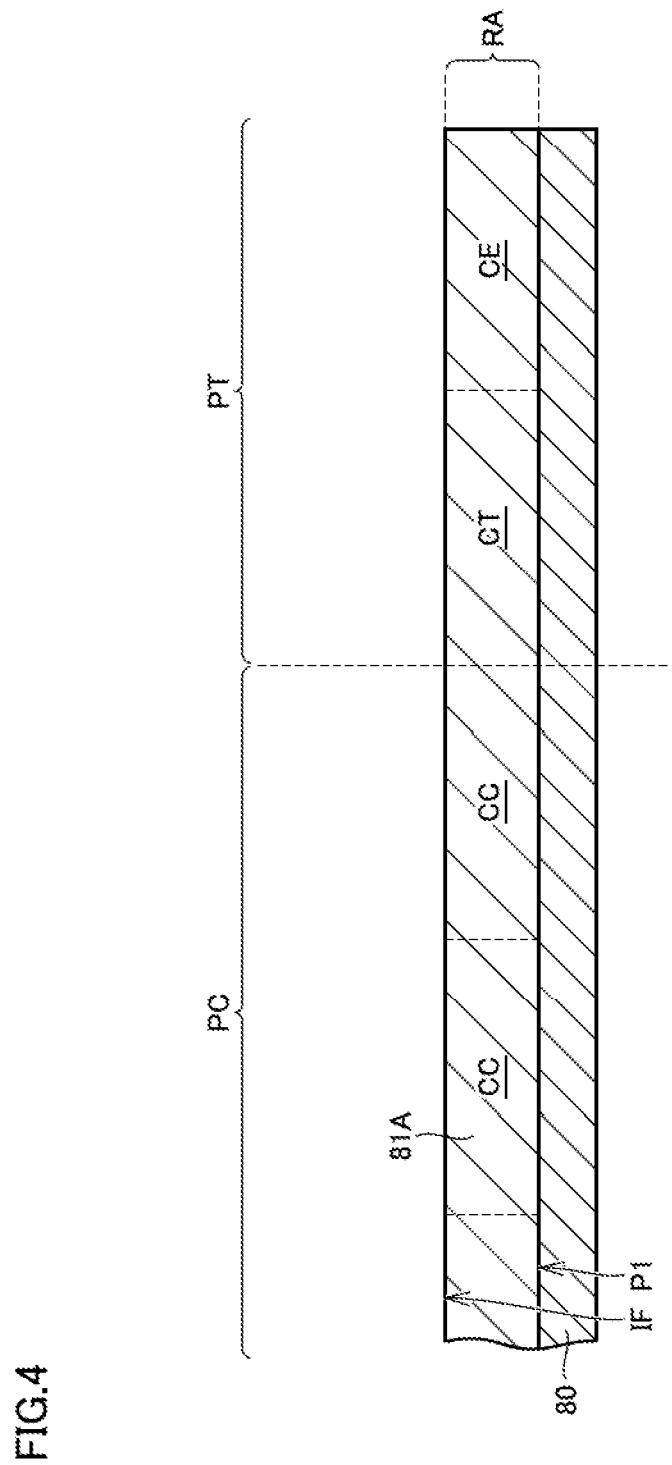
FIG. 4 is a partial cross sectional view schematically showing a first step of a method for manufacturing the silicon carbide semiconductor device of FIG. 2.

As shown in FIG. 4, on single-crystal substrate 80, lower drift layer 81A is formed by means of epitaxial growth of silicon carbide. The surface on which the epitaxial growth is performed preferably has an off angle of 8° or less relative to a {000-1} plane, more preferably, has an off angle of 8° or less relative to a (000-1) plane. The epitaxial growth can be performed by a CVD method. As a source material gas, a mixed gas of silane ($SiH_4$) and propane ($C_3H_8$) can be used, for example. In doing so, it is preferable to introduce nitrogen (N) or phosphorus (P) as an impurity, for example.

Figure 5:
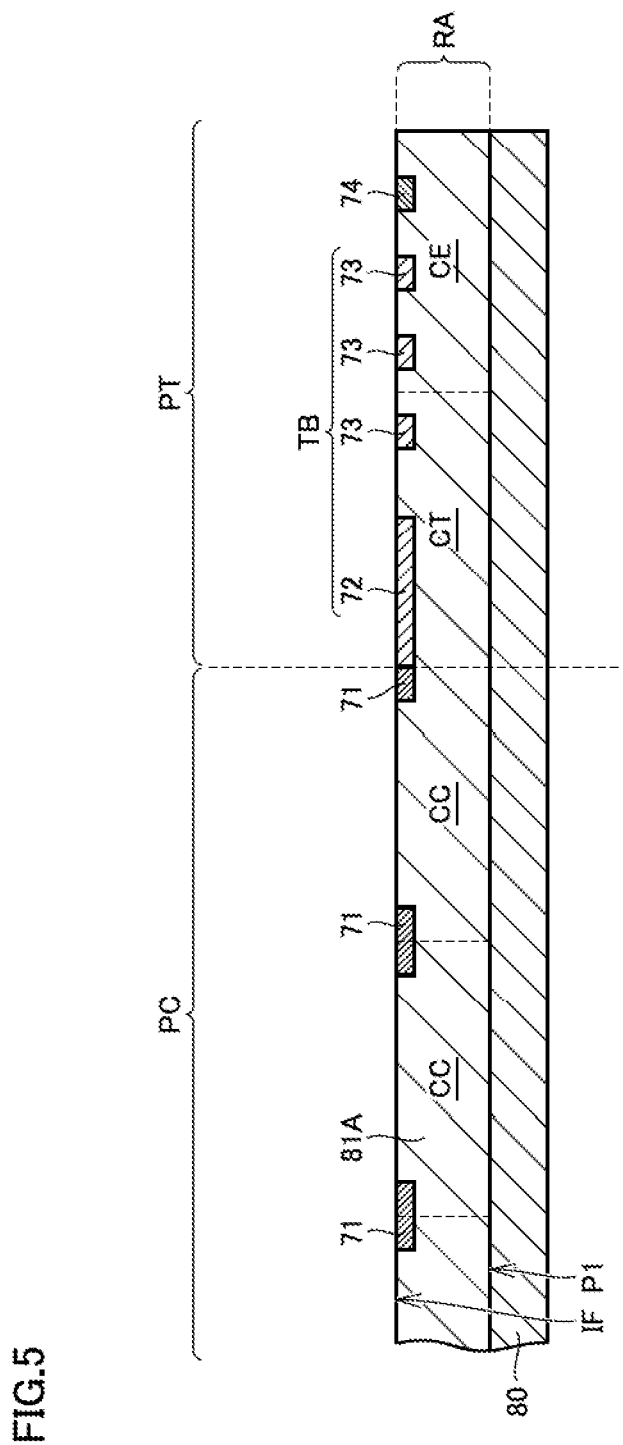
FIG. 5 is a partial cross sectional view schematically showing a second step of the method for manufacturing the silicon carbide semiconductor device of FIG. 2.

As shown in FIG. 5, impurity regions are formed by impurity ion implantation into interface IF, which is exposed at this point of time. Specifically, relaxation region 71 is partially formed at interface IF of central section CC. Moreover, in outer edge portion PT, JTE region 72, guard ring region 73, and field stop region 74 are formed partially at interface IF. The impurity regions can be formed in any order. As an acceptor impurity, aluminum can be used, for example. As a donor impurity, phosphorus can be used, for example.

Figure 6:
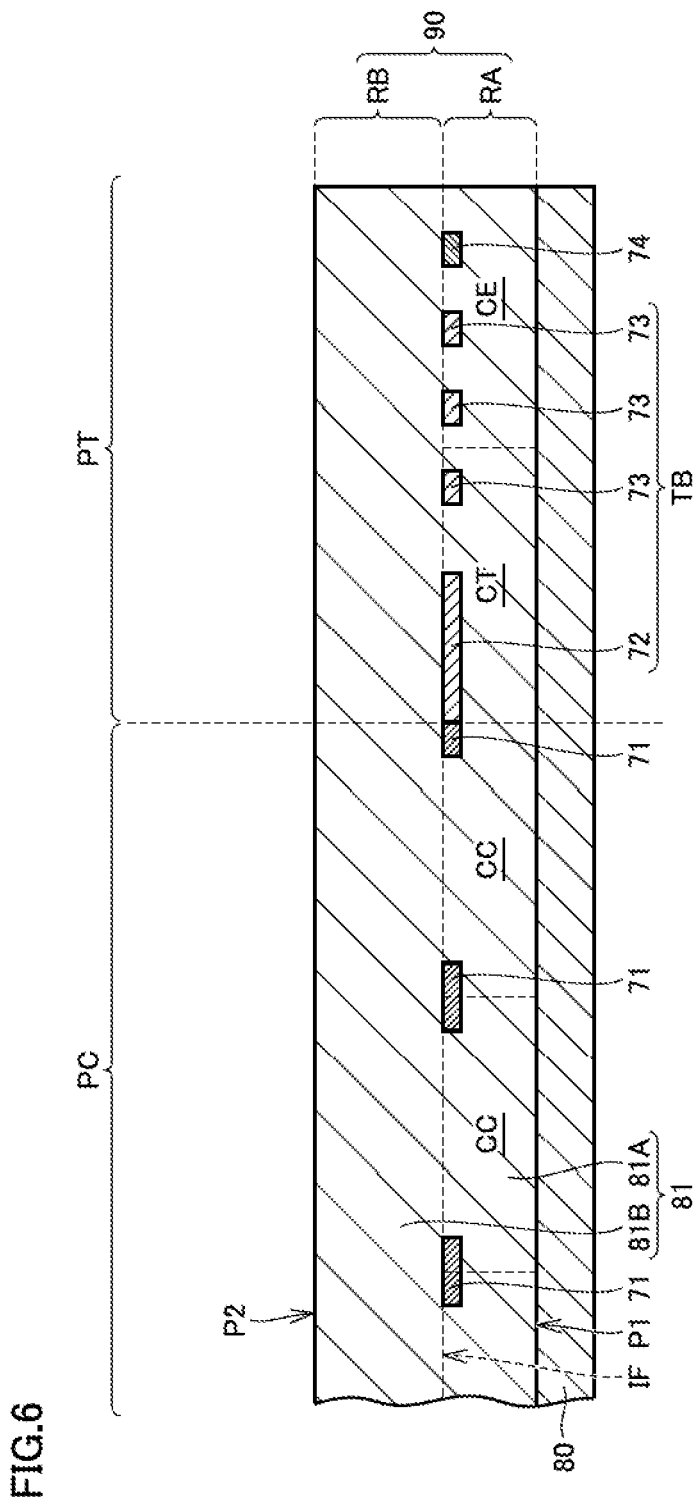
FIG. 6 is a partial cross sectional view schematically showing a third step of the method for manufacturing the silicon carbide semiconductor device of FIG. 2.

As shown in FIG. 6, upper drift layer 81B is formed by the same method as that for lower drift layer 81A. Accordingly, epitaxial film 90 having lower range RA and upper range RB is obtained.

Figure 7:
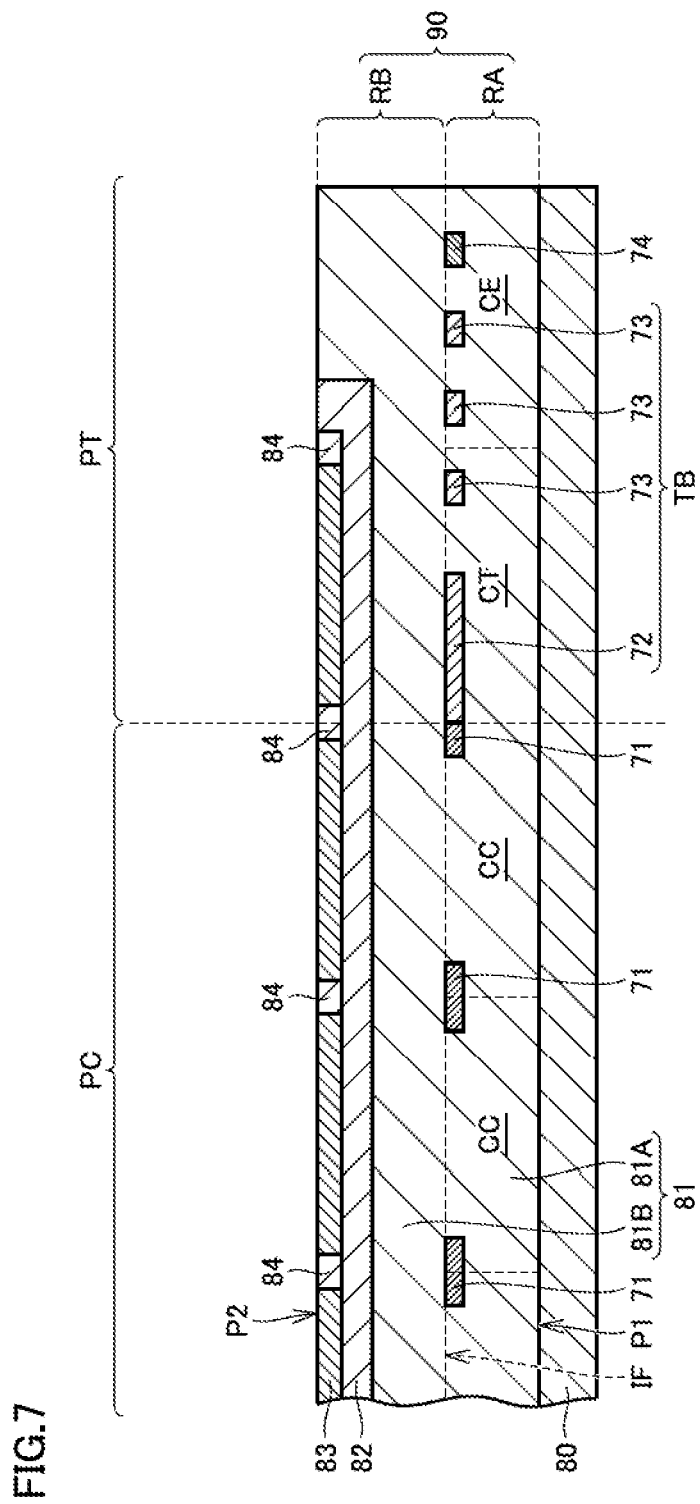
FIG. 7 is a partial cross sectional view schematically showing a fourth step of the method for manufacturing the silicon carbide semiconductor device of FIG. 2.

As shown in FIG. 7, impurity regions are formed by impurity ion implantation into upper surface P2 of epitaxial film 90. Specifically, base layer 82 is formed on upper drift layer 81B. Moreover, source region 83 separated from upper drift layer 81B by base layer 82 is formed on base layer 82. Moreover, contact region 84 is formed to extend from upper surface P2 to base layer 82. The impurity regions can be formed in any order. Next, heat treatment is performed to activate the impurities. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as argon atmosphere.

Figure 8:
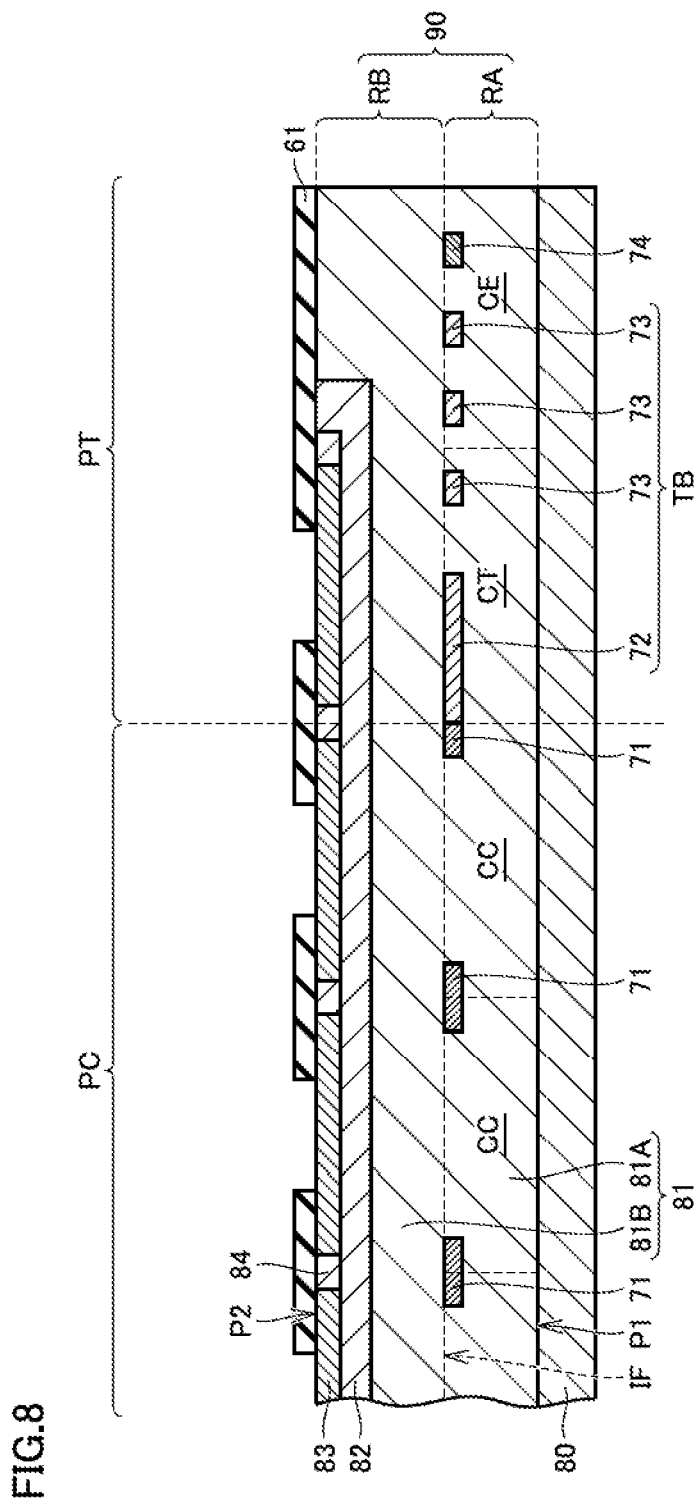
FIG. 8 is a partial cross sectional view schematically showing a fifth step of the method for manufacturing the silicon carbide semiconductor device of FIG. 2.

As shown in FIG. 8, a mask layer 61 having an opening is formed on upper surface P2 of epitaxial film 90. The opening is formed to correspond to the position of trench TR (FIG. 2). Mask layer 61 is preferably made of silicon dioxide, and is more preferably formed by thermal oxidation.

Figure 9:
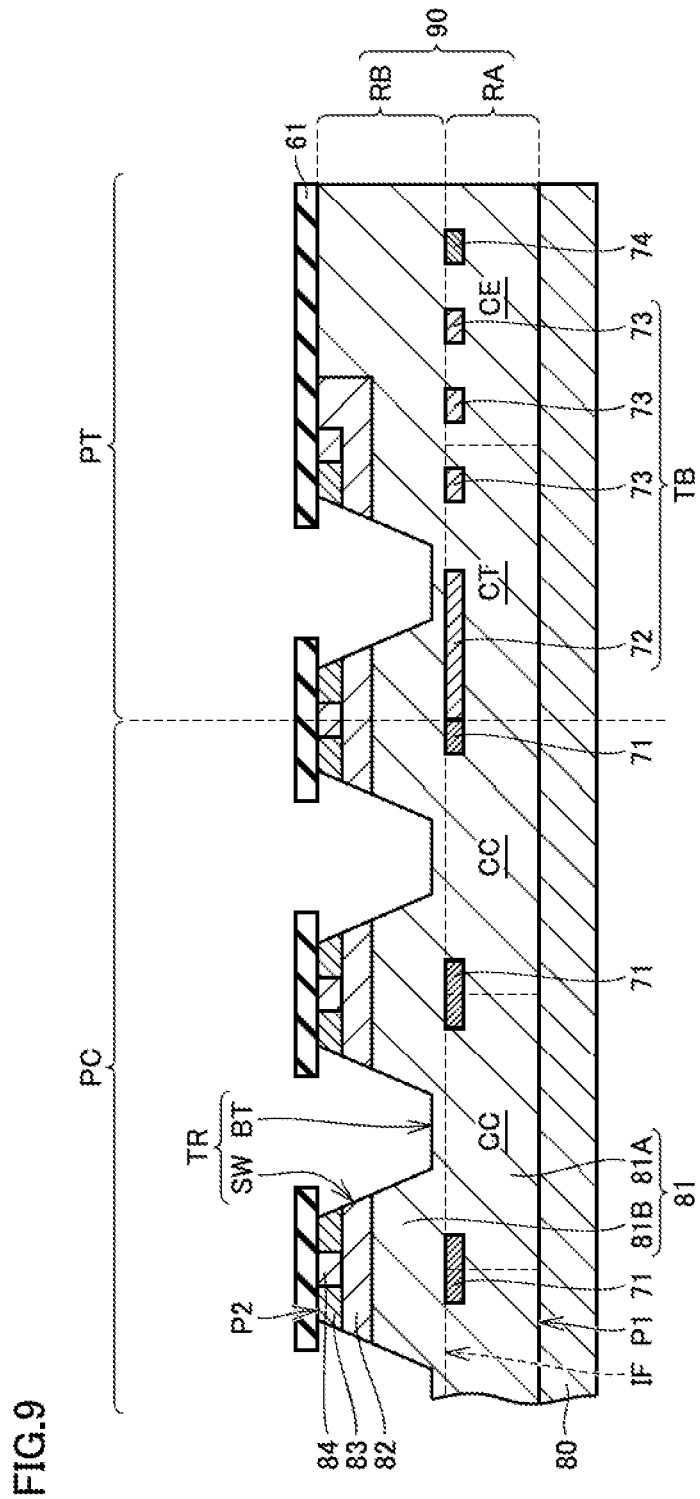
FIG. 9 is a partial cross sectional view schematically showing a sixth step of the method for manufacturing the silicon carbide semiconductor device of FIG. 2.
Figure 10:
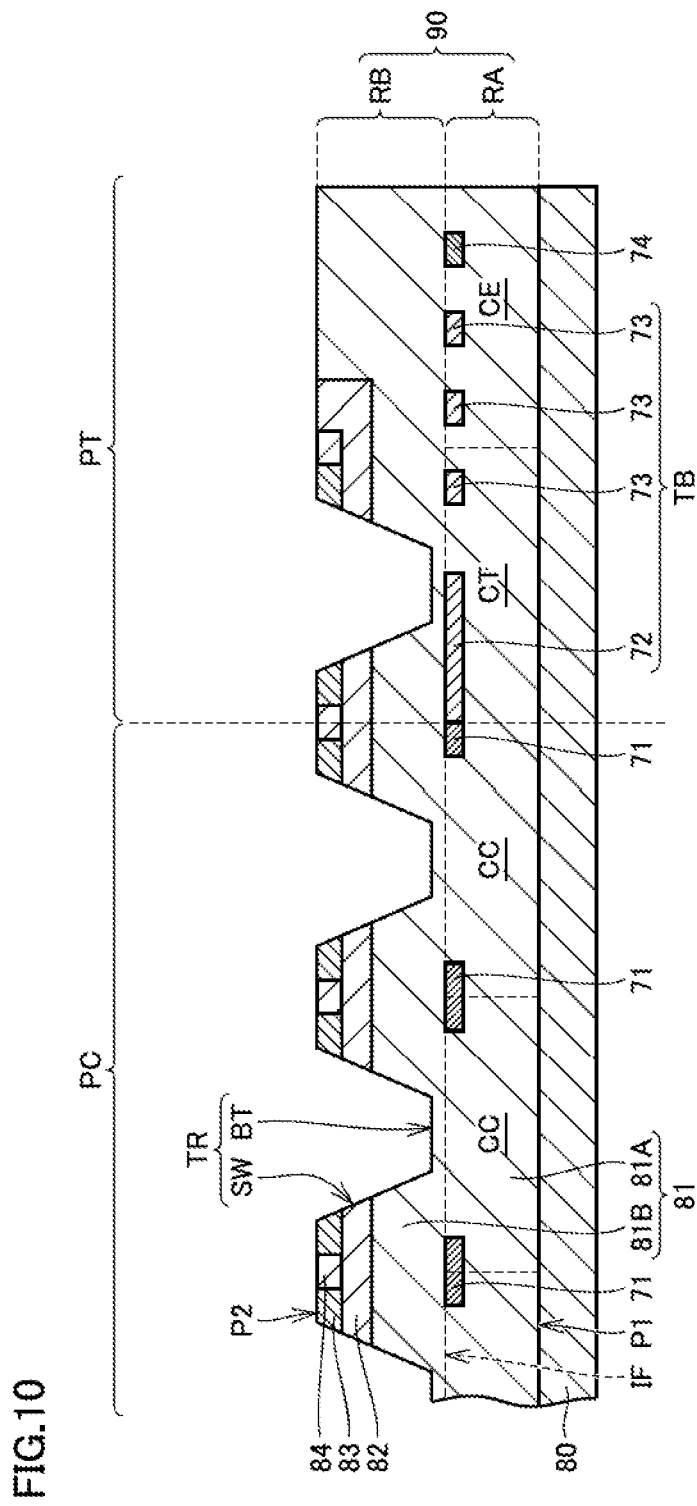
FIG. 10 is a partial cross sectional view schematically showing a seventh step of the method for manufacturing the silicon carbide semiconductor device of FIG. 2.

As shown in FIG. 9, thermal etching using mask layer 61 is performed. Details of the thermal etching will be described later. By this thermal etching, trench TR is formed in upper surface P2 of epitaxial film 90. In doing so, a special plane is spontaneously formed on side wall surface SW of trench TR, in particular, on base layer 82. Next, mask layer 61 is removed by means of an appropriate method such as etching (FIG. 10).

Figure 11:
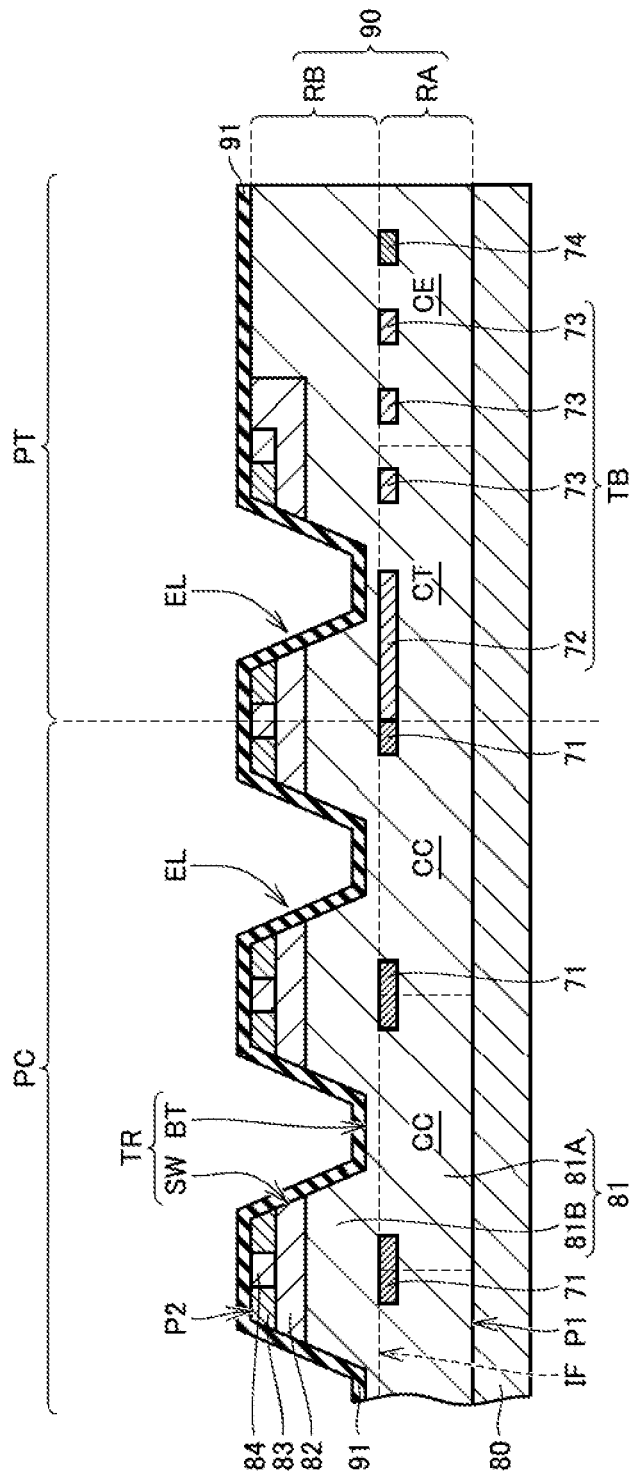
FIG. 11 is a partial cross sectional view schematically showing an eighth step of the method for manufacturing the silicon carbide semiconductor device of FIG. 2.

As shown in FIG. 11, gate oxide film 91 is formed on side wall surface SW and bottom surface BT of trench TR. Gate oxide film 91 has a portion connecting upper drift layer 81B and source region 83 to each other on base layer 82. Gate oxide film 91 is preferably formed by thermal oxidation.

After the formation of gate oxide film 91, NO annealing may be performed using nitrogen monoxide (NO) gas as an atmospheric gas. A temperature profile has such a condition that the temperature is not less than 1100° C. and not more than 130° C. and holding time is approximately 1 hour, for example. Accordingly, nitrogen atoms are introduced in an interface region between gate oxide film 91 and base layer 82. As a result, formation of interface states in the interface region is suppressed, thereby achieving improved channel mobility. It should be noted that a gas other than the NO gas can be employed as the atmospheric gas as long as the nitrogen atoms can be thus introduced. After this NO annealing, Ar annealing may be further performed using argon (Ar) as an atmospheric gas. The Ar annealing is preferably performed at a heating temperature higher than the heating temperature in the above-described NO annealing and lower than the melting point of gate oxide film 91. This heating temperature is held for approximately 1 hour, for example. Accordingly, formation of interface states in the interface region between gate oxide film 91 and base layer 82 is further suppressed. It should be noted that instead of the Ar gas, an inert gas such as nitrogen gas can be employed as the atmospheric gas.

Figure 12:
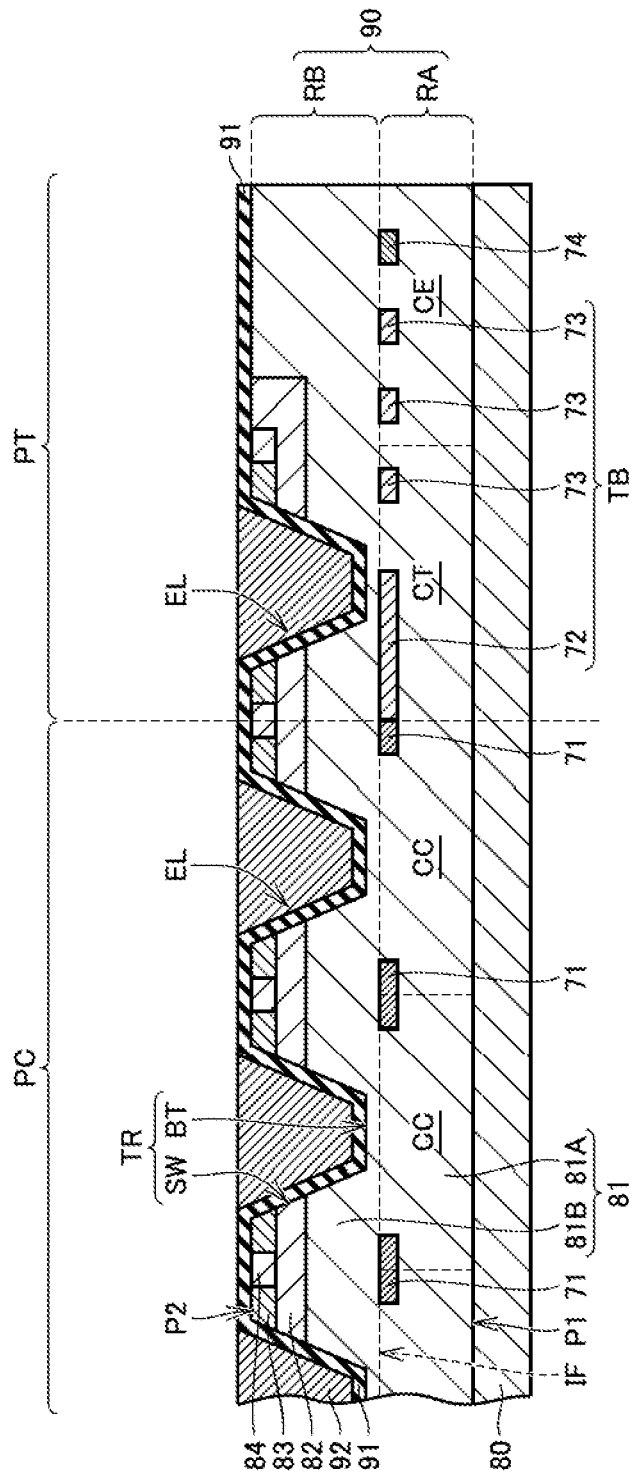
FIG. 12 is a partial cross sectional view schematically showing a ninth step of the method for manufacturing the silicon carbide semiconductor device of FIG. 2.

As shown in FIG. 12, gate electrode 92 is formed on gate oxide film 91. Specifically, gate electrode 92 is formed on gate oxide film 91 so as to fill the region within trench TR with gate oxide film 91 interposed therebetween. A method for forming gate electrode 92 can be performed by, for example, forming a film of conductor or doped silicon and performing CMP (Chemical Mechanical Polishing).

Figure 13:
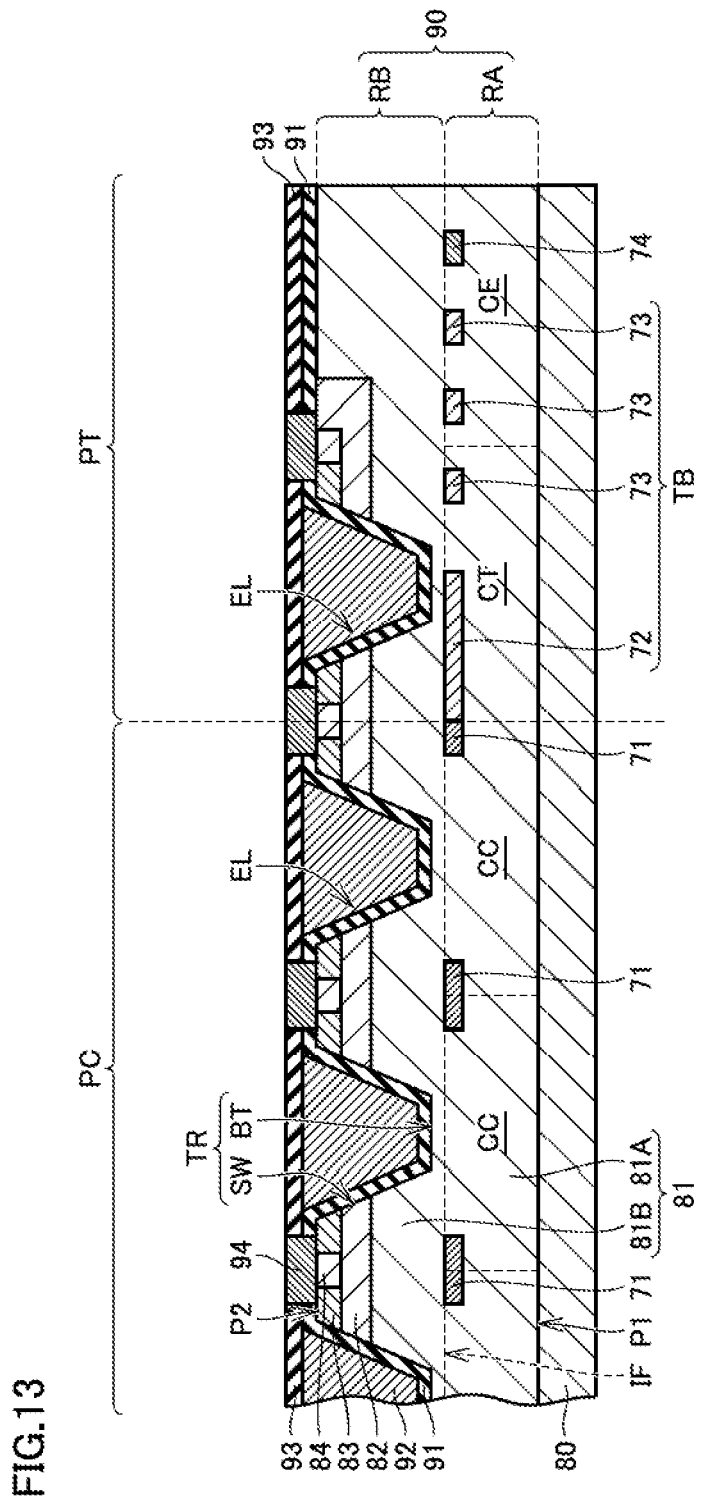
FIG. 13 is a partial cross sectional view schematically showing a tenth step of the method for manufacturing the silicon carbide semiconductor device of FIG. 2.

Referring to FIG. 13, interlayer insulating film 93 is formed on gate electrode 92 and gate oxide film 91 so as to cover the exposed surface of gate electrode 92. Etching is performed to form an opening in interlayer insulating film 93 and gate oxide film 91. Through the opening, each of source region 83 and contact region 84 is exposed on upper surface P2. Next, on upper surface P2, source electrode 94 is formed in contact with each of source region 83 and n contact region 84.

With reference to FIG. 2 again, drain electrode 98 is formed on lower drift layer 8 IA with single-crystal substrate 80 interposed therebetween. Source interconnection layer 95 is formed. In this way, MOSFET 200 is obtained.

(Thermal Etching)

Thermal etching is performed by subjecting an object, to be etched, to a reactive gas under a high temperature, and has substantially no physical etching function. The reactive gas can react with silicon carbide under heating. By supplying the reactive gas to epitaxial film 90 under heating, epitaxial film 90 is etched.

The reactive gas preferably contains a halogen element. The halogen element preferably includes chlorine or fluorine. For example, as the reactive gas, there can be used a process gas containing at least one of $Cl_2$, $BCl_3$, $CF_4$ and $SF_6$. A particularly suitable reactive gas is $Cl_2$. The process gas may also include oxygen gas. The process gas preferably includes a carrier gas. Examples of the carrier gas usable include nitrogen gas, argon gas, or helium gas.

In order to secure an etching rate, the lower limit of the heating temperature of epitaxial film 90 for thermal etching is preferably about 700° C., is more preferably about 800° C., and is further preferably about 900° C. On the other hand, in order to suppress etching damage, the upper limit of the heating temperature is preferably about 1200° C., is more preferably about 1100° C., and is further preferably about 1000° C.

In the thermal etching, silicon carbide is etched at an etching rate of about 70 μm/hour, for example. The etching rate for silicon dioxide is much smaller than this, so that mask layer 61 (FIG. 8 and FIG. 9) can be significantly suppressed from being consumed as long as it is made of silicon dioxide.

(Function and Effect of Present Embodiment)

According to MOSFET 200 (FIG. 2) of the present embodiment, transistor elements EL are provided not only in central portion PC but also in outer edge portion PT. In other words, not only in central portion PC but also in outer edge portion PT, element structures are provided to offer a function intrinsic to a semiconductor device (such as a switching function).

Moreover, outer edge section CT includes a portion having an impurity concentration different from the impurity concentration of central section CC by having at least a portion of outer edge embedded region TB. Accordingly, outer edge section CT can be provided with a termination structure (for example, JTE region 72 and guard ring region 73) for increasing the breakdown voltage of MOSFET 200.

As described above, outer edge portion PT is provided with both the element structure and the termination structure. Accordingly, outer edge portion PT is effectively utilized in the plane layout as compared with a case where outer edge portion PT has only one of the element structure and the termination structure. Therefore, while increasing the breakdown voltage, the size of MOSFET 200 can be made small.

Further, because the material of epitaxial film 90 is silicon carbide, MOSFET 200 can handle a high voltage such as one with which a maximum electric field of 0.4 MV/cm or more is applied to drift region 81. Moreover, because relaxation region 71 and outer edge embedded region TB are provided, MOSFET 200 can be configured such that under the above voltage application, the maximum electric field strength in upper range RB becomes less than half of the maximum electric field strength in lower range RA. This leads to further decrease of electric field strength, which serves as a determination factor for breakdown voltage, in upper range RB in the vicinity of transistor element EL. Specifically, the electric field strength applied to gate oxide film 91 is made lower at a corner portion formed by side wall surface SW and bottom surface BT of trench TR. Conversely, the maximum electric field strength in lower range RA is twice or more as large as the maximum electric field strength in upper range RB in central portion PC, whereby the maximum electric field strength in lower range RA, which does not serve as the determination factor for breakdown voltage, is made higher. Accordingly, a higher voltage can be applied to MOSFET 200. That is, the breakdown voltage can be increased.

It should be noted that the structure of MOSFET 200 (FIG. 2) is such that increased voltage is held by lower range RA as compared with that by upper range RB in outer edge portion PT during the OFF state. If such a structure is applied to a Si semiconductor device instead of the SiC semiconductor device, a breakage phenomenon of the Si layer in lower range RA is likely to take place, thus failing to attain a high breakdown voltage. A high breakdown voltage is particularly less likely to be obtained when no guard ring is used in upper surface P2 at a portion corresponding to additional section CE in the thickness direction. Therefore, the structure of MOSFET 200 is not much suitable for the Si semiconductor device, and is particularly suitable for the SiC semiconductor device.

(Modification)

Figure 14:
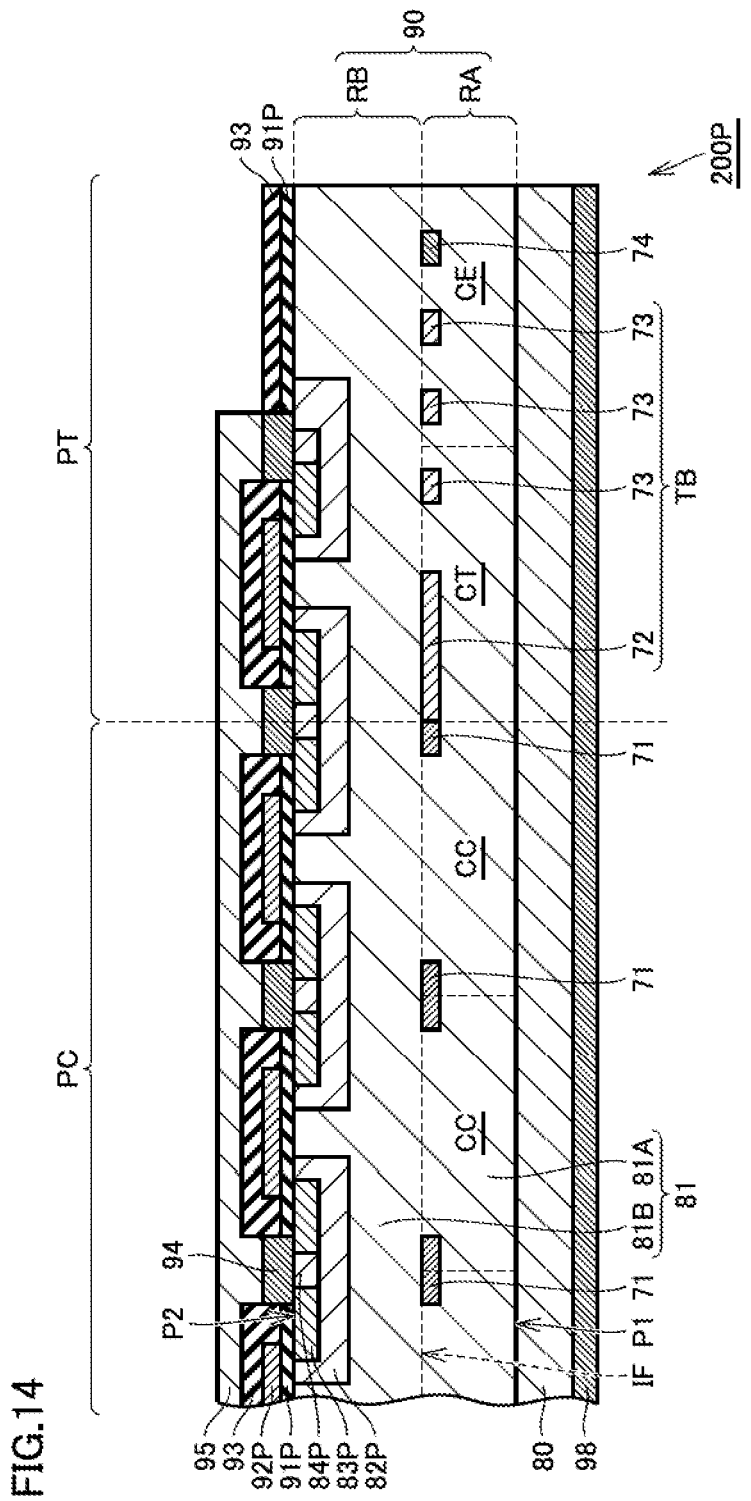
FIG. 14 is a partial cross sectional view schematically showing a configuration of a silicon carbide semiconductor device in a modification of FIG. 2.

As shown in FIG. 14, a MOSFET 200P, which is a modification of MOSFET 200 (FIG. 2), is a planer type. Specifically, trench TR (FIG. 2) is not provided in upper surface P2 of epitaxial film 90, and impurity regions including a base layer 82P, a source region 83P, and a contact region 84P are formed in flat P2. Moreover, a gate oxide film 91P is provided on flat P2. A gate electrode 92P is provided on gate oxide film 91P.

(Configuration of Special Plane)

As described above, side wall surface SW (FIG. 2) of trench TR preferably has a "special plane" particularly on base layer 82. The following describes a case where side wall surface SW has a special plane.

Figure 15:
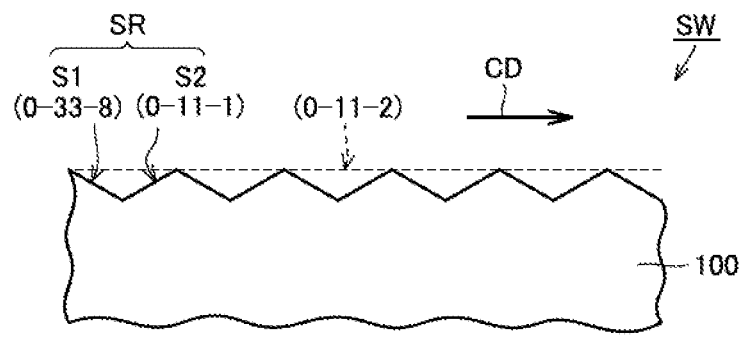
FIG. 15 is a partial cross sectional view schematically showing a fine structure in a surface of the silicon carbide film included in the silicon carbide semiconductor device.

As shown in FIG. 15, side wall surface SW having the special plane has a plane S1 (first plane). Plane S1 has a plane orientation of {0-33-8}, and preferably has a plane orientation of (0-33-8). Preferably, side wall surface SW microscopically includes plane S1. Preferably, side wall surface SW further microscopically includes a plane S2 (second plane). Plane S2 has a plane orientation of {0-11-1}, and preferably has a plane orientation of (0-11-1). Here, the term "microscopically" refers to "minutely to such an extent that at least the size about twice as large as an interatomic spacing is considered". As a method for observing such a microscopic structure, for example, a TEM (Transmission Electron Microscope) can be used.

Preferably, side wall surface SW has a combined plane SR. Combined plane SR is formed of periodically repeated planes S1 and S2. Such a periodic structure can be observed by, for example, TEM or AFM (Atomic Force Microscopy). Combined plane SR has a plane orientation of {0-11-2}, and preferably has a plane orientation of (0-11-2). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example. Preferably, in the channel surface, carriers flow in a channel direction CD, in which the above-described periodic repetition is done.

Next, a detailed structure of combined plane SR will be illustrated.

Figure 16:
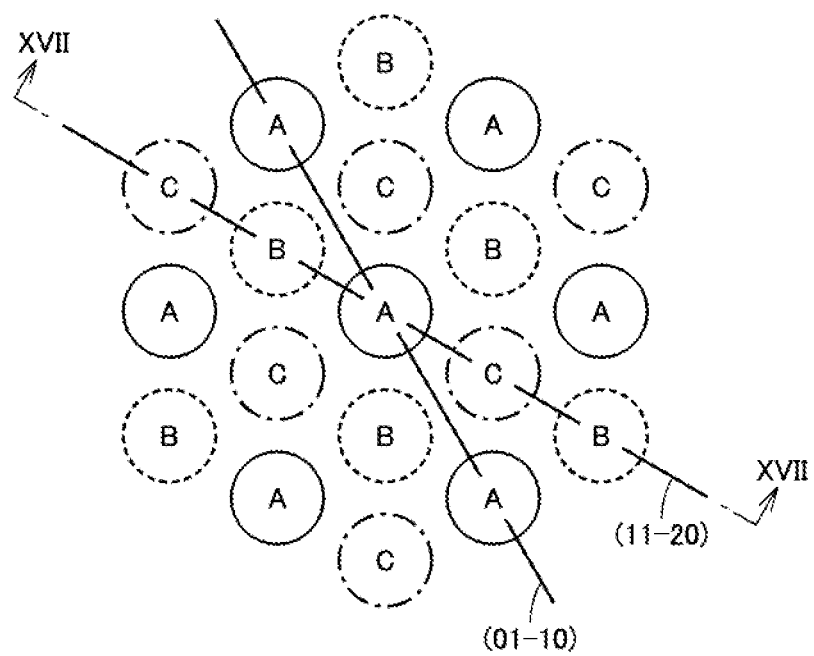
FIG. 16 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 16. In other words, with four layers ABCB being regarded as one period, a periodic stacking structure such as ABCBAB-CBABCB . . . is provided.

Figure 17:
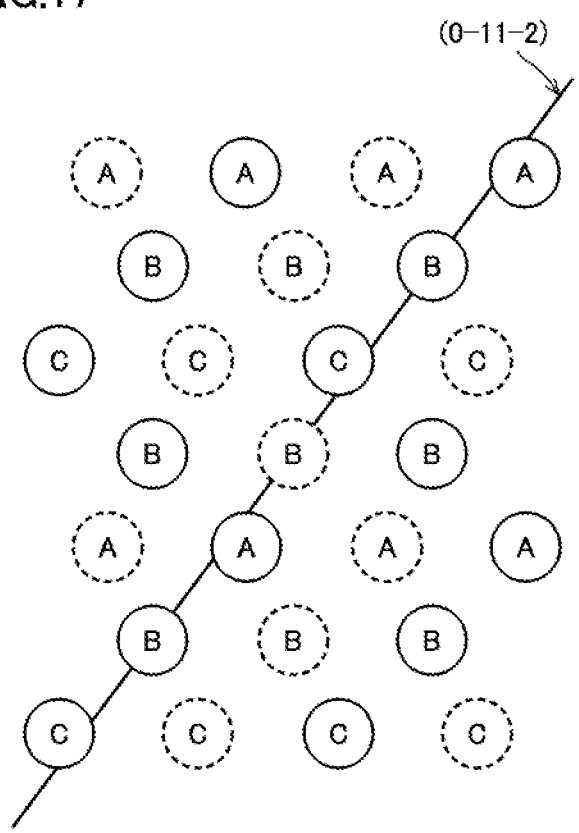
FIG. 17 shows a crystal structure of a (11-20) plane along a line XVI-XVI of FIG. 16.

As shown in FIG. 17, in the (11-20) plane (cross section taken along a line XVII-XVII of FIG. 16), atoms in each of four layers ABCB constituting the above-described one period are not aligned completely along the (0-11-2) plane. In FIG. 17, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to {0-11-2}, this surface can have various structures microscopically.

Figure 18:
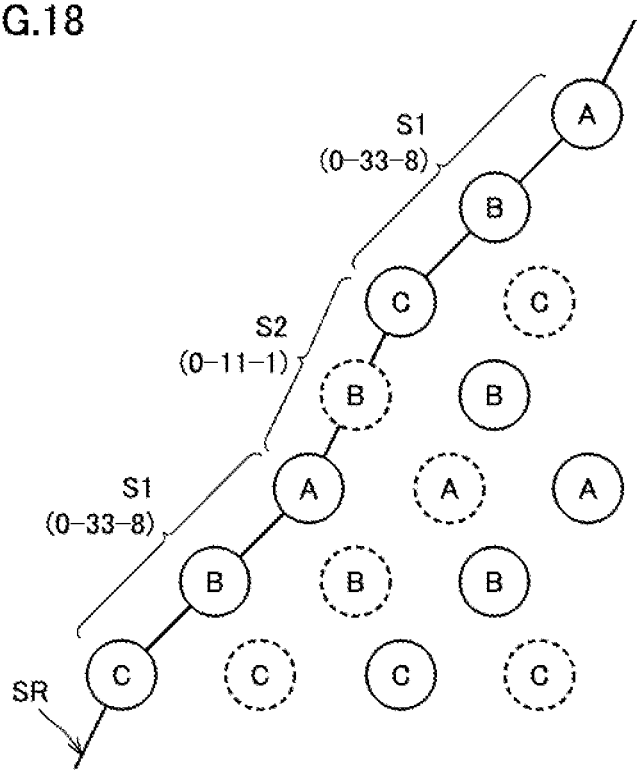
FIG. 18 shows a crystal structure in the vicinity of a surface with a combined plane of FIG. 15 within a (11-20) plane.

As shown in FIG. 18, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 17).

Figure 19:
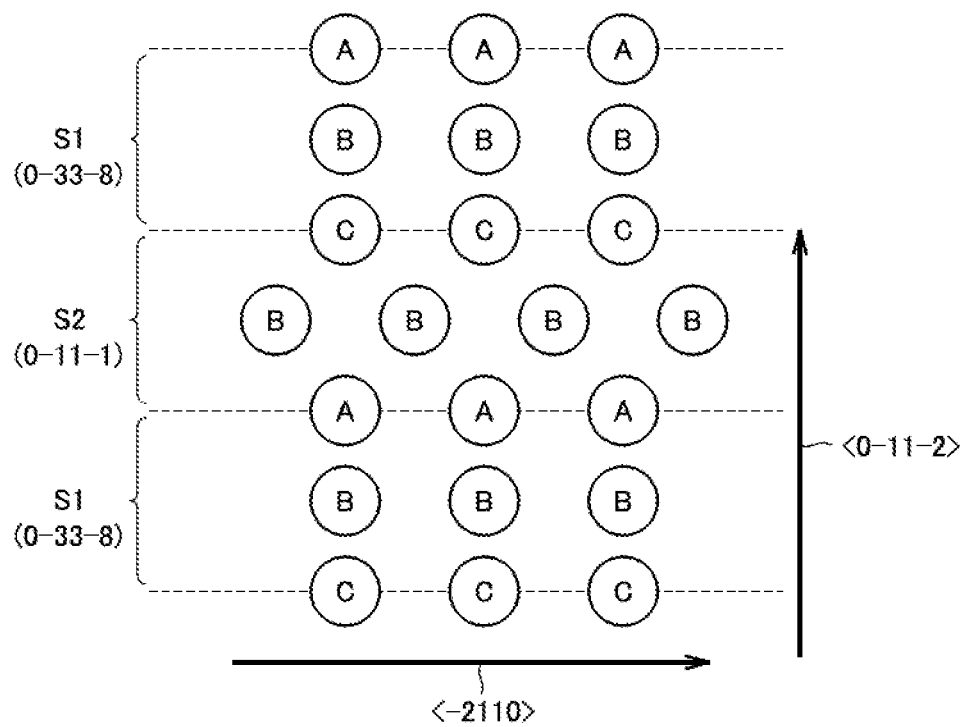
FIG. 19 shows the combined plane of FIG. 15 when viewed from a (01-10) plane.

As shown in FIG. 19, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 19) having a plane orientation of (001) in the structure equivalent to the cubic structure and the planes (planes S2 in FIG. 19) connected to the foregoing planes and having a plane orientation different from that of each of the foregoing planes. The polytype may be 6H or 15R, for example.

Figure 20:
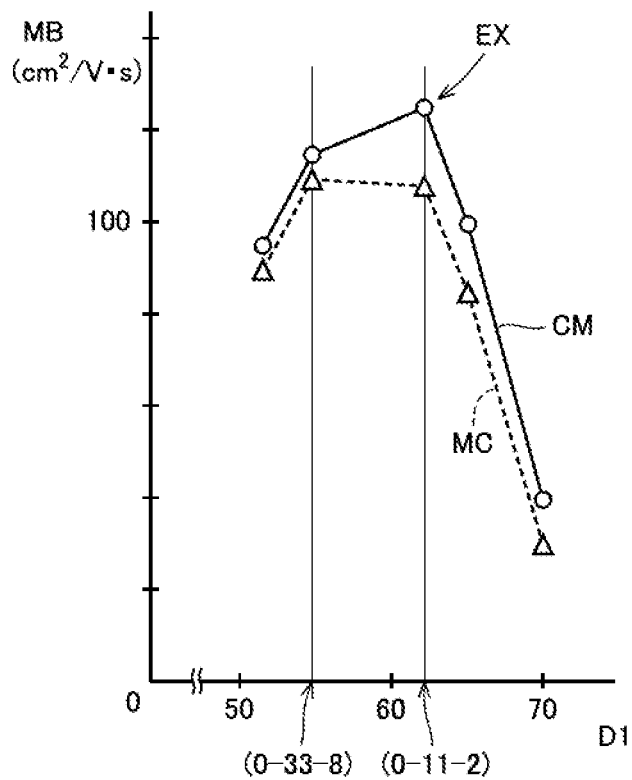
FIG. 20 is a graph showing an exemplary relation between channel mobility and an angle between a channel surface and the (000-1) plane when macroscopically viewed, in each of a case where thermal etching is performed and a case where no thermal etching is performed.

Next, with reference to FIG. 20, the following describes a relation between the crystal plane of side wall surface SW and mobility MB of the channel surface. In the graph of FIG. 20, the horizontal axis represents an angle D1 formed by the (000-1) plane and the macroscopic plane orientation of side wall surface SW having the channel surface, whereas the vertical axis represents mobility MB. A group of plots CM correspond to a case where side wall surface SW is finished to correspond to a special plane by thermal etching, whereas a group of plots MC correspond to a case where side wall SW is not thermally etched.

In group of plots MC, mobility MB is at maximum when the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 18 and FIG. 19, the multiplicity of planes S1 each having a plane orientation of (0-33-8) are densely and regularly arranged with planes S2 interposed therebetween, whereby a ratio of the microscopic plane orientation of (0-33-8) becomes high in the channel surface.

Figure 21:
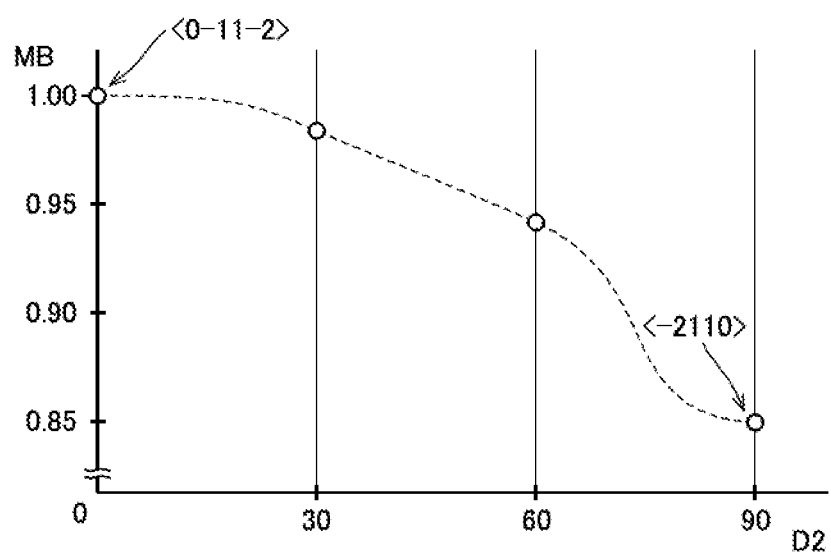
FIG. 21 is a graph showing an exemplary relation between the channel mobility and an angle between a channel direction and a <0-11-2> direction.

It should be noted that mobility MB has orientation dependency on combined plane SR. In a graph shown in FIG. 21, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 15) preferably has an angle D2 of not less than 0° and not more than 60° more preferably, substantially 0°.

Figure 22:
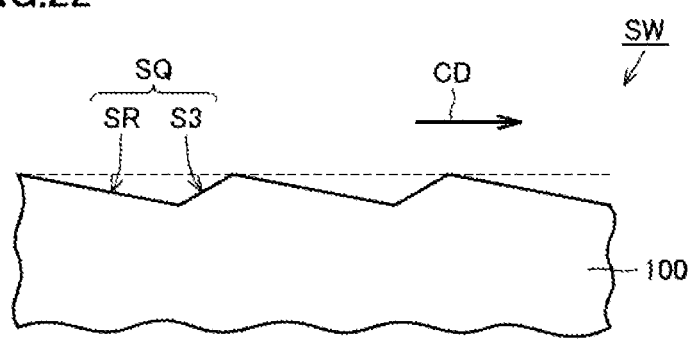
FIG. 22 shows a modification of FIG. 15.

As shown in FIG. 22, side wall surface SW may further include a plane S3 (third plane) in addition to combined plane SR (illustrated in a simplified manner by a straight line in FIG. 22). In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation corresponding to a {0-33-8}plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation corresponding to a (0-33-8) plane.

More specifically, side wall surface SW may include a combined plane SQ constituted of periodically repeated plane S3 and combined plane SR. Such a periodic structure can be observed by, for example, TEM or AFM (Atomic Force Microscopy).

(Silicon Carbide Semiconductor Device having Special Plane)

When side wall surface SW (FIG. 2) of trench TR includes plane S1 (FIG. 15), a channel is formed in a plane having a plane orientation of {0-33-8}. Accordingly, part of on-resistance contributed by channel resistance is suppressed. Therefore, while maintaining the on-resistance to be equal to or less than a predetermined value, resistance by drift region 81 can be increased. Therefore, the impurity concentration of drift region 81 can be made lower. Therefore, the breakdown voltage of MOSFET 200 can be more increased. When side wall surface SW of trench TR microscopically includes plane S1 and plane S2, the on-resistance can be further suppressed. Accordingly, the breakdown voltage can be more increased. When planes S1 and S2 of side wall surface SW construct combined plane SR, the on-resistance can be suppressed further. Accordingly, the breakdown voltage can be more increased.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

For example, the channel type of the silicon carbide semiconductor device may be p channel type, and in this case, there can be employed a configuration in which the p type and the n type are replaced with each other in the above-described embodiment. The silicon carbide semiconductor device may be a MISFET (Metal Insulator Semiconductor Field Effect Transistor) other than the MOSFET, and may be a device other than the MISFET. Examples of silicon carbide semiconductor devices other than the MISFET include an IGBT (Insulated Gate Bipolar Transistor). Moreover, the outer edge embedded region does not necessarily need to include both the guard ring region and the JTE region. The relaxation region may be omitted. The field stop region may be omitted. By removing the single-crystal substrate, the first electrode may be directly in contact with the first main surface of the silicon carbide film.

REFERENCE SIGNS LIST

71: relaxation region; 72: JTE region (junction terminal region); 73: guard ring region; 74: field stop region; 80: single-crystal substrate; 81: drift region (breakdown voltage holding region); 81A: lower drift layer (first breakdown voltage holding layer); 81B: upper drift layer (second breakdown voltage holding layer); 82, 82P: base layer; 83, 83P: source region; 84, 84P: contact region; 90: epitaxial film (silicon carbide film); 91, 91P: gate oxide film (gate insulating film); 92, 92P: gate electrode; 93: interlayer insulating film; 94: source electrode (second main electrode); 95: source interconnection layer; 98: drain electrode (first main electrode), 200, 200P: MOSFET (silicon carbide semiconductor device); CC: central section; CE: additional section; CT: outer edge section, EL: transistor element (semiconductor element); IF: interface; P1: lower surface (first main surface). P2: upper surface (second main surface); PC: central portion; PT: outer edge portion; RA: lower range (first range); RB: upper range (second range); SW: side wall surface; TR: trench.

The invention claimed is:

1. A silicon carbide semiconductor device having a plane layout including a central portion and an outer edge portion that surrounds said central portion and that constitutes an outer edge, the silicon carbide semiconductor device comprising:
a silicon carbide film having a first main surface and a second main surface opposite to said first main surface in a thickness direction, said silicon carbide film having a first range that constitutes said first main surface and a second range that constitutes said second main surface, said first and second ranges having an interface separated from said first and second main surfaces between said first and second ranges, said first range including a first breakdown voltage holding layer and an outer edge embedded region, said first breakdown voltage holding layer constituting said first main surface and having a first conductivity type, said outer edge embedded region being provided partially at said interface in said outer edge portion and having said second conductivity type, said second range including a second breakdown voltage holding layer that constitutes said interface and that has said first conductivity type, said first and second breakdown voltage holding layers constituting a breakdown voltage holding region in which said outer edge embedded region is embedded, said second range being provided with a semiconductor element for controlling current from one of said second main surface and said interface to the other, said first range having a central section and an outer edge section, said central section facing said semiconductor element in said central portion in the thickness direction, said outer edge section facing said semiconductor element in said outer edge portion in the thickness direction, said outer edge section including a portion that has an impurity concentration different from an impurity concentration of said central section by having at least a portion of said outer edge embedded region at said interface, the impurity contributing to said second conductivity type;
a first electrode facing said first main surface in each of said central portion and said outer edge portion; and
a second electrode in contact with said second main surface in each of said central portion and said outer edge portion.

2. The silicon carbide semiconductor device according to claim 1, wherein said outer edge embedded region includes a guard ring region that surrounds said central portion at said interface.

3. The silicon carbide semiconductor device according to claim 1, wherein said first range includes a relaxation region that is partially provided at said interface, that is surrounded by said outer edge embedded region at said interface, that has at least a portion included in said central portion, and that has said second conductivity type.

4. The silicon carbide semiconductor device according to claim 3, wherein said outer edge embedded region includes a junction terminal region that is in contact with said relaxation region and that has an impurity concentration lower than an impurity concentration of said relaxation region.

5. The silicon carbide semiconductor device according to claim 1, wherein said first range includes a field stop region that is partially provided at said interface in said outer edge portion, that surrounds said outer edge embedded region at said interface, that has said first conductivity type, and that has an impurity concentration higher than an impurity concentration of said first breakdown voltage holding layer.

* * * * *